United States Patent [19]

Jonas et al.

[11] Patent Number: 4,702,953
[45] Date of Patent: Oct. 27, 1987

[54] LAMINATES OF POLYHYDANTOINS

[75] Inventors: Friedrich Jonas, Aachen; Richard Müller; Rudolf Merten, both of Leverkusen; Ludwig Rottmaier, Odenthal, all of Fed. Rep. of Germany

[73] Assignee: Bayer Aktiengesellschaft, Leverkusen, Fed. Rep. of Germany

[21] Appl. No.: 729,919

[22] Filed: May 3, 1985

[30] Foreign Application Priority Data

May 15, 1984 [DE] Fed. Rep. of Germany ....... 3417941

[51] Int. Cl.$^4$ .................. B32B 15/08; C08K 7/02; C08K 7/12
[52] U.S. Cl. .................. 428/209; 428/425.8; 428/901; 525/908; 528/44; 528/73
[58] Field of Search .................. 428/423.1, 426, 209, 428/425.8, 432, 901; 525/908

[56] References Cited

U.S. PATENT DOCUMENTS

| | | |
|---|---|---|
| 3,397,253 | 8/1968 | Merten et al. . |
| 3,726,895 | 4/1978 | Habermeier et al. ............... 525/908 |
| 3,809,696 | 5/1974 | Perret et al. ......................... 525/908 |
| 3,812,201 | 5/1974 | Bey ...................................... 525/908 |
| 3,947,619 | 3/1976 | Wank .................................... 428/57 |
| 3,966,683 | 6/1976 | Merten et al. ....................... 525/908 |
| 4,206,104 | 6/1980 | Dowbenko et al. ................ 525/908 |
| 4,243,778 | 1/1981 | Heim et al. .......................... 525/908 |
| 4,298,515 | 11/1981 | Lewalter et al. .................... 524/751 |

FOREIGN PATENT DOCUMENTS

| | | |
|---|---|---|
| 1230568 | 12/1966 | Fed. Rep. of Germany . |
| 2161043 | 6/1973 | Fed. Rep. of Germany . |
| 1536923 | 9/1968 | France . |
| 0092852 | 1/1969 | France . |
| 0092853 | 1/1969 | France . |
| 2248221 | 5/1975 | France . |
| 1403410 | 8/1975 | United Kingdom . |
| 1480631 | 7/1977 | United Kingdom . |

*Primary Examiner*—Allan M. Lieberman
*Attorney, Agent, or Firm*—Connolly & Hutz

[57] ABSTRACT

The invention relates to laminates of polyhydantoins.

18 Claims, No Drawings

LAMINATES OF POLYHYDANTOINS

This invention relates to laminates of polyhydantoins.

Polyhydantoins are known (for example from DE-OS NO. 17 20 624). They are mainly used as electrical insulating lacquers, for example as coatings on conductor wires.

It is known from DE-OS No. 23 33 523 that hydantoins containing amide-imide groups can be used for the production of laminates. It is known from U.S. Pat. No. 3,876,584 that polyhydantoins corresponding to the following formula (I):

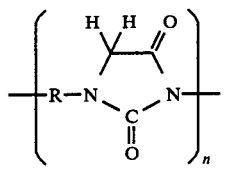

(I)

which contain only one unsubstituted hydantoin ring in the very small recurring unit (head-to-head polymers) can be used for lamination. Unfortunately, the property spectrum of such laminates is not always entirely satisfactory or adequate.

It has now been found that laminates of polyhydantoins having very good properties can be obtained if the very small recurring units on which the polyhydantoins are based contain two polyhydantoin rings which are attached head-to-tail.

Accordingly, the present invention provides laminates of fibrous materials, polyhydantoins attached head-to-tail and, optionally, other organic polymers and to a process for their production.

Suitable polyhydantoins attached head-to-tail correspond to the following formula (II):

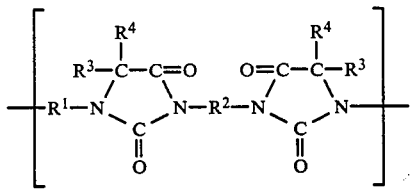

(II)

in which $R^1$ and $R^2$ each represents a $C_2$-$C_{20}$ (preferably $C_2$-$C_{12}$)alkylene radical optionally substituted by halogen, such as chlorine and bromine and/or by $C_1$-$C_{10}$ (preferably $C_1$-$C_4$)alkylene groups, a $C_6$-$C_{14}$ (preferably $C_6$-$C_{10}$)arylene radical, a $C_5$-$C_{12}$ (preferably $C_5$-$C_{10}$)cycloalkylene radical, a $C_7$-$C_{20}$ (preferably $C_7$-$C_{14}$)aralkylene radical and an arylene or cycloalkylene radical containing heteroatoms, such as N, O or S, in the ring, the arylene, cycloalkylene and aralkylene radicals optionally being interrupted by $C_1$-$C_4$ alkylene radicals, O, S or $SO_2$ and/or substituted by one to four $C_1$-$C_4$-alkylene radicals. $R^3$ and $R^4$ each represents a hydrogen atom, a $C_1$-$C_{20}$ (preferably $C_1$-$C_{12}$)alkyl radical, a $C_6$-$C_{12}$-aryl radical (preferably phenyl), a $C_5$-$C_{12}$ (preferably $C_5$-$C_6$) cycloalkyl radical or a $C_7$-$C_{15}$ (preferably $C_7$-$C_{10}$)aralkyl radical; where $R^3$ is hydrogen, $R^4$ represents a radical corresponding to the formula —$CH_2$—$COR^5$ in which $R^5$ is an amino group, a $C_1$-$C_{10}$ (preferably $C_1$-$C_4$)alkylamino, $C_1$-$C_{10}$ (preferably $C_1$-$C_4$)dialkylamino, $C_1$-$C_{10}$ (preferably $C_1$-$C_4$)alkoxy or $C_6$-$C_{10}$-aroxy (preferably phenoxy) group.

The radicals $R^3$ and $R^4$, as members of a cyclic $C_2$-$C_{20}$-alkyl radical, may also be attached to one another and substituted by halogen (chlorine, bromine).

Particularly preferred radicals are: $R^1$ and $R^2$: —$CH_2$—$_m$ with $m=2,6$.

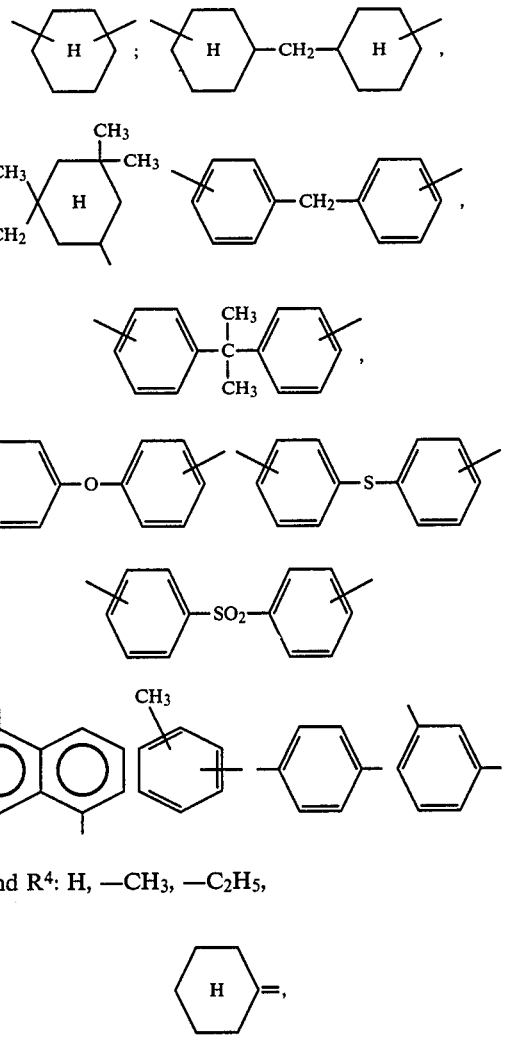

$R^3$ and $R^4$: H, —$CH_3$, —$C_2H_5$,

—$CH_2$—$COOCH_3$, —$CH_2COOC_2H_5$

Polyhydantoins suitable for use in accordance with the invention may be produced by methods known per se. Thus, aspartic acid esters produced, for example, from poly-amines and 1,2-alkylene dicarboxylic acid esters may be reacted with polyisocyanates, followed by cyclization (cf. for example DE-PS No. 1 720 624). According to U.S. Pat. No. 3,397,253, polyhydantoins may be produced, for example, by reacting glycine ester derivatives and polyisocyanates. A variant of this method is described in U.S. Pat. No. 4,298,515, according to which cyclic carboxylic acid anhydride compounds are also used.

In the production of the laminates according to the invention, it is advantageous to obtain polyhydantoin solutions which combine a high solids content with a relatively low viscosity and which are present in a form known as the "B-stage" in novolak chemistry.

This is advantageously achieved by partially condensing the polyhydantoins, the condensation times and temperatures differing for the various polyhydantoins. Thus, in the reaction between aspartic acid esters and polyisocyanate, the condensation temperature should not exceed 200° C. and should advantageously be in the range of from 130° to 180° C.

Another possible method of obtaining low-viscosity polyhydantoins is to use an excess of one of the starting components, particularly the polyisocyanate, during the production of the polyhydantoins. An excess of only 1 to 50 mole% of isocyanate leads to polyhydantoins containing (masked) isocyanate groups which continue reacting on compression at elevated temperature and give temperature-resistant polyhydantion laminates.

The laminates may be produced by impregnating fibrous materials, for example glass fiber mats, with a solution of the polyhydantoin which may optionally contain other organic polymers and/or catalysts. The solvent is then evaporated, the glass fiber mats obtained, which are tack-free at room temperature and can be rolled up, are laid one on top of the other in several layers and hardened under pressure at an elevated temperature to form the final laminate.

During the condensation which the polyhydantoin udergoes in the meantime, hardly any bubble formation can be observed despite the considerable layer thickness.

Suitable fibrous materials are, for example, glass, asbestos, textile, quartz or carbon fibers in the form of filaments, nonwovens, rovings, mats or cloths.

The solvents used for the production of the polyhydantoins may serve as the solvents for the polymer solutions used.

Examples of suitable solvents are amides, such as dimethyl formamide, N-methyl pyrrolidone, dimethyl acetamide; phenols, such as phenol and cresol; ethers and esters, such as diethylene glycol monomethyl ether, glycol monomethyl ether acetate, glycol monoethyl ether acetate, benzoic acid methyl ester; alcohols, such as benzyl alcohol, diacetone alcohol; ketones, such as acetophenone, cyclohexanone; lactones, such as caprolactone, butyrolactone. They may be used either individually or in admixture. Phenol, cresol, dimethyl formamide, dimethyl acetamide, N-methyl pyrrolidone, cyclohexanone, butyrolactone, are preferably used.

Additional diluents, for example diluting solvents, may be added to the polymer solutions. It is preferred to use chlorinated hydrocarbons, such as methylene chloride, ethylene chloride; aromatic hydrocarbons, such as toluene, xylenes; esters, such as butyl acetate, methyl glycol acetate, ethylene glycol acetate; or ketones, such as methyl isobutyl ketone.

Examples of organic polymers which may be added to the polyhyhdantoin solutons are novolak resins, polyepoxides, for example tris-glycidyl isocyanurate, tris-glycidyl-triazolidine-3,5-dione, polyepoxide resins based on bisphenol A, polyamide imides, polyimides, polyesters, polyamides, polyester amides, polyacetals, polyimide isocyanates.

Examples of catalysts which can accelerate the hardening of the laminate are organic bases, such as Dabco ®, hexamethylene tetramine; metal salts, for example tin octoate, titanium tetrabutylate, copper ethyl hexanoate; metal complex salts, for example Ni-acetylacetonate, Cu-acetylacetonate, iron-(III) acetylacetonate. The laminates are hardened at temperatures in the range from 180° to 400° C., preferably at temperatures in the range from 200° to 350° C. and, more preferably, at temperatures in the range from 220° to 300° C. under a pressure in the range from 0.5 to 100 kp/cm² and preferably under a pressure of from 5 to 50 kp/cm². The necessary time is between a few minutes and several hours, preferably from 5 to 60 minutes.

The laminates thus obtained are characterised by their high temperature resistance and by high softening temperatures combined with very favorable mechanical properties.

One particular application is, for example, in the electronics field, for example for the producton of circuit boards for electronic components, for example by the multilayer process.

These circuit boards may be produced from the laminates by known methods, for example by lamination with copper foils.

EXAMPLES

Production of the polyhydantoin solutions

Polyhydantoin solution A:

576 g (4 moles) of maleic acid dimethyl ester in 1670 g of dimethyl formamide are introduced into a reactor equipped with an internal thermometer, stirrer and distillation bridge. 232 g (2 moles) of hexamethylene diamine in 490 g of dimethyl formamide are then added dropwise with stirring at 5° to 10° C. After heating to room temperature (20°–25° C.), the mixture is stirred at that temperature for about 20 hours. 535 g (2.14 moles) of 4,4'-diisocyanatodiphenylmethane are then introduced at a temperature below 50° C., followed by heating while stirring for 1 hour at 50° C., for 1 hour at 100° C. and for 10 hours at 130° to 150° C., approx. 125 g of methanol distilling off.

3350 g of a polyhydantoin solution having a solids content of 34% and a viscosity $\eta$ of 176 mPas are obtained.

Polyhydantoin solution B:

576 g (4 moles) of maleic acid dimethyl ester in 500 ml of methanol are introduced into a reactor equipped with an internal thermometer, stirrer and distillation bridge. 232 g (2 moles) of hexamethylene diamine in 200 ml of methanol are then added dropwise with stirring at 5° to 10° C. After heating to room temperature (20° to 25° C.), the mixture is stirred for about 12 hours at that temperature. The methanol is then distilled off in vacuo (approx. 20 mbar) at internal temperature of at most 30° C. After the addition of 2150 g of cyclohexanone, 504 g (2016 moles) of 4,4'-diisocyanatodiphenylmethane are introduced at temperature below 70° C., followed by heating in the same way as described in Example 1.

3350 g of a polyhydantoin solution having a solids content of 34% and a viscosity $\eta$ of 210 mPas are obtained.

Polyhdydantoin solution C:

199 g of 4,4'-bis-(methoxycarbonyl-isopropylamino)-diphenylmethane are dissolved in 300 g of butyrolactone and 100 g of toluene, followed by the addition of 19.2 g of trimellitic acid anhydride. 150 g of 4,4'-diisocyanatodiphenylmethane are then introduced at 35° C., followed by stirring for 2 hours at 35° C. The solution obtained is left standing overnight, followed by the addition of 0.5 g of triethylene diamine. After heating to 180° C., the mixture is stirred for 6 hours at 180° C., methanol and toluene distilling off. Dilution with 310 g of butyrolactone gives 1090 g of a 30% polyhydantoin solution which has a viscosity $\eta_{25}$ of 1615 mPas.

Polyhydantoin solution D:

199 g of 4,4′-bis-(methoxycarbonyl-isopropylamino)-diphenylmethane are dissolved in 400 g of commercially available m-cresol, followed by the addition at 35° C. of 125 g of 4,4′-diisocyanato-diphenylmethane. The solution obtained is stirred for 1 hour at 35° C., followed by the addition of 0.5 g of triethylene diamine. After heating to 165° C., the mixture is stirred for 1 hour at 165° C. Dilution with 475 g of m-cresol gives 1210 g of a polyhydantoin solution which, after dilution with m-cresol to 15% has a viscosity $\eta_{25}$ of 870 mPas.

Production of the laminates

EXAMPLE 1

A glass filament cloth weighing 200 g/m² is impregnated with polyhydantoin solution A and the solvent is evaporated at 120° C. in a hot air cabinet. The resin-impregnated carrier layers are compressed into laminates in 30 minutes at 240° C. under a pressure of 10 kp/cm².

The laminate obtained shows a high softening temperature coupled with very good mechanical properties.

EXAMPLE 2

The procedure is as described in Example 1, except that polyhydantoin solution B is used. Compression is completed in 20 minutes at 250° C./20 kp/cm².

The laminate obtained has a high softening temperature and very good mechanical properties.

EXAMPLE 3

A glass filament cloth weighing 200 g/m² is impregnated with a mixture of polyhydantoin solution B and a commercially available 33% polyamide imide (Resistherm ® Aj 133 L) in a ratio of 9:1 and processed in the same way as described in Example 2.

The laminate obtained has a very high softening temperature and very good mechanical properties.

EXAMPLE 4

A glass filament cloth weighing 200 g/m² is impregnated with polyhydantoin solution C and the solvent evaporated at 180° C. in a hot air cabinet. The resin-impregnated carrier layers are compressed into laminates in 60 minutes at 250° C. under a pressure of 10 kp/cm².

The laminate obtained has a very high softening temperature and very favorable mechanical properties.

EXAMPLE 5

The procedure is as described in Example 3 using polyhydantoin solution D. Compression is completed in 20 minutes at 300° C. under a pressure of 20 kp/cm².

The laminate obtained has a high softening temperature and very good mechanical properties.

EXAMPLE 6

A glass filament cloth weighing 200 g/m² is impregnated with a mixture of polhydantoin solution B and polhydantoin solution C in a ratio of 2:1. Compression is completed in 30 minutes at 250° C. under a pressure of 20 kp/cm².

The laminate obtained has a very high softening temperature and very good mechanical properties.

We claim:

1. A laminate comprising polyhydantoins of units attached head-to-tail corresponding to

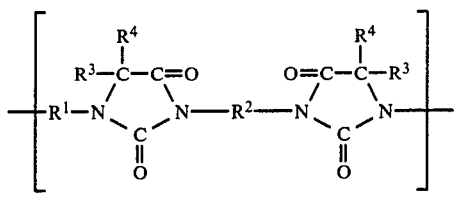

where
- $R^1$ and $R^2$ are independently a $C_2$–$C_{20}$-alkylene radical, a $C_2$–$C_{20}$-alkylene radical substituted with halogen, a $C_2$–$C_{20}$-alkylene radical substituted with $C_1$–$C_{10}$-alkyl groups, or combinations thereof, a $C_6$–$C_{14}$-arylene radical, a $C_5$–$C_{12}$-cycloalkylene radical, or a $C_7$–$C_{20}$-aralkylene radical,
- $R^3$ is hydrogen, $R^4$ is a radical —$CH_2$—$COR^5$, in which $R^5$ is an amino group, a $C_1$–$C_{10}$-alkylamino, a $C_1$–$C_{10}$-dialkylamino, a $C_1$–$C_{10}$-alkoxy or a $C_6$–$C_{10}$-aroxy group and
- a fibrous filler or reinforcing material.

2. A laminate as claimed in claim 1 wherein $R^1$ and $R^2$ are independently a $C_2$–$C_{12}$-alkylene radical, a $C_2$–$C_{12}$ alkylene radical substituted with halogen, a $C_2$–$C_{12}$-alkylene radical substituted with $C_1$–$C_4$-alkyl goups, or combinations thereof, a $C_6$–$C_{10}$-arylene radical, a $C_5$–$C_{10}$-cycloalkylene radical or a $C_7$–$C_{14}$-aralkylene radical.

3. A laminate in accordance with claim 1, wherein the halogen is chlorine or bromine.

4. A laminate in accordance with claim 2, wherein the halogen is chlorine or bromine.

5. A laminate in accordance with claim 1, wherein the $C_6$–$C_{14}$-arylene radical or the $C_5$–$C_{12}$-cycloalkylene radical contains a heteroatom in the ring.

6. A laminate in accordance with claim 5, wherein the heteroatom is N, O or S.

7. A laminate in accordance with claim 2, wherein the $C_6$–$C_{10}$-alkylene radical or the $C_5$–$C_{10}$-cycloalkylene radical contains a heteroatom in the ring.

8. A laminate in accordance with claim 7, wherein the heteroatom is N, O or S.

9. A laminate in accordance with claim 1, wherein the $C_6$–$C_{14}$-arylene radical, the $C_5$–$C_{12}$-cycloalkylene radical, or the $C_7$–$C_{14}$-aralkylene radical is interrupted by a $C_1$–$C_4$ alkylene radical, O, S or $SO_2$, is substituted with one to four $C_1$–$C_4$ alkyl radicals, or both.

10. A laminate in accordance with claim 1, wherein the $C_6$–$C_{10}$-arylene radical, the $C_5$–$C_{10}$-cycloalkylene radical, or the $C_7$–$C_{14}$-aralkylene radical is interrupted by a $C_1$–$C_4$ alkylene radical, O, S, or $SO_2$, is substituted with one to four $C_1$–$C_4$ alkyl radicals, or both.

11. A laminate in accordance with claim 1, wherein the cyclic $C_2$–$C_{20}$-alkylene radical formed by $R^3$ and $R^4$ is substituted with halogen.

12. A laminate in accordance with claim 1, further comprising at least one additional organic polymer.

13. A process for producing a laminate of polyhydantoins of units attached head-to-tail corresponding to

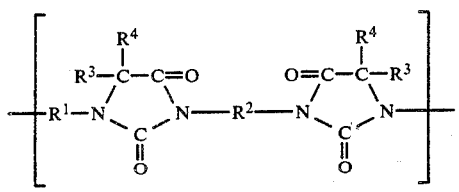

where
R$^1$ and R$^2$ are independently a C$_2$–C$_{20}$-alkylene radical, a C$_2$–C$_{20}$-alkylene radical substituted with halogen, a C$_2$–C$_{20}$-alkylene radical substituted with C$_1$–C$_{10}$-alkyl groups, or combinations thereof, a C$_6$–C$_{14}$-arylene radical, a C$_5$–C$_{12}$-cycloalkylene radical, or a C$_7$–C$_{20}$-aralkylene radical, a C$_7$–C$_{20}$-aralkylene radical, R$^3$ is hydrogen, R$^4$ is a radical —CH$_2$COR$^5$, in which R$^5$ is an amino group, a C$_1$–C$_{10}$-alkylamino, a C$_1$–C$_{10}$-dialkylamino, a C$_1$–C$_{10}$-alkoxy or a C$_6$–C$_{10}$-aroxy group and a fibrous filler or reinforcing material, comprising combining the polyhydantoins with the fibrous filler or reinforcing material to form a mass, then compressing and hardening the mass at elevated temperatures to form the laminate.

14. A process in accordance with claim 13, further comprising adding at least one additional organic polymer to the mass prior to compressing and hardening.

15. A process in accordance with claim 13, wherein the halogen is chlorine or bromine.

16. A process in accordance with claim 13, wherein the C$_6$–C$_{14}$-aryl radical or the C$_5$–C$_{12}$-cycloalkyl radical contains a heteroatom in the ring.

17. A circuit board for electronic components comprising a metal-coated laminate, where the laminate is in accordance with claim 1.

18. A circuit board in accordance with claim 17, further comprising additional laminate layers.

* * * * *